(12) United States Patent
Lee et al.

(10) Patent No.: US 10,700,273 B2
(45) Date of Patent: Jun. 30, 2020

(54) PROTEIN-BASED NONVOLATILE MEMORY DEVICE AND METHOD FOR MANUFACTURING THE SAME

(71) Applicant: Research & Business Foundation Sungkyunkwan University, Suwon-si (KR)

(72) Inventors: Sungjoo Lee, Seongnam-si (KR); Woo-Seok Choe, Suwon-si (KR); Sung Kyu Jang, Bucheon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/136,570

(22) Filed: Sep. 20, 2018

(65) Prior Publication Data
US 2019/0097130 A1 Mar. 28, 2019

(30) Foreign Application Priority Data
Sep. 20, 2017 (KR) .......................... 10-2017-0121355

(51) Int. Cl.
*G11C 11/00* (2006.01)
*H01L 45/00* (2006.01)
(Continued)

(52) U.S. Cl.
CPC .......... *H01L 45/08* (2013.01); *G11C 13/0019* (2013.01); *H01L 27/2463* (2013.01); *H01L 45/085* (2013.01); *H01L 45/1233* (2013.01); *H01L 45/1266* (2013.01); *H01L 45/14* (2013.01); *H01L 45/1608* (2013.01); *H01L 51/0093* (2013.01); *H01L 51/0098* (2013.01); *H01L 51/0591* (2013.01); *G11C 2013/009* (2013.01); *G11C 2013/0083* (2013.01); *G11C 2213/15* (2013.01); *H01L 51/0003* (2013.01)

(58) Field of Classification Search
CPC . H01L 45/08; H01L 45/1608; H01L 51/0093; H01L 51/0003; H01L 27/2463; H01L 45/1223; H01L 45/1226; H01L 45/14; H01L 51/0591
USPC ........................................ 365/151
See application file for complete search history.

(56) References Cited

U.S. PATENT DOCUMENTS

| | | | | |
|---|---|---|---|---|
| 5,874,214 A * | 2/1999 | Nova | ................... | B01J 19/0046 365/151 |
| 6,416,714 B1 * | 7/2002 | Nova | ................... | B01J 19/0046 422/403 |

(Continued)

FOREIGN PATENT DOCUMENTS

| | | |
|---|---|---|
| JP | 4366449 B2 | 11/2009 |
| JP | 2011-96714 A | 5/2011 |

(Continued)

*Primary Examiner* — Viet Q Nguyen
(74) *Attorney, Agent, or Firm* — NSIP Law (57) ABSTRACT

In a first aspect of the present disclosure, there is provided a nonvolatile memory device comprising: two electrodes; and a protein switching layer interposed between the two electrodes and including an amino acid, wherein then a voltage is applied to one of the electrodes, the amino acid chelates with an active electrode material to form a conductive filament, wherein the formation of the conductive filament allows a resistance state of the device to vary.

12 Claims, 9 Drawing Sheets

(51) Int. Cl.
*H01L 51/00* (2006.01)
*H01L 27/24* (2006.01)
*G11C 13/00* (2006.01)
*H01L 51/05* (2006.01)

(56) References Cited

U.S. PATENT DOCUMENTS

| | | | | |
|---|---|---|---|---|
| 6,706,473 | B1* | 3/2004 | Edman | B01J 19/0046 435/6.12 |
| 6,730,537 | B2* | 5/2004 | Hutchison | B82Y 10/00 438/99 |
| 6,824,974 | B2* | 11/2004 | Pisharody | C12Q 1/003 205/777.5 |
| 2004/0219731 | A1* | 11/2004 | Hartwich | B82Y 10/00 438/200 |
| 2006/0063207 | A1* | 3/2006 | Lin | G01N 33/54306 435/7.1 |
| 2007/0037133 | A1* | 2/2007 | Brott | B82Y 10/00 435/4 |
| 2007/0285843 | A1* | 12/2007 | Tran | B82Y 10/00 360/245.9 |
| 2009/0090905 | A1* | 4/2009 | Tokita | B82Y 10/00 257/40 |
| 2010/0032653 | A1* | 2/2010 | Takeda | B82Y 10/00 257/24 |
| 2010/0264409 | A1* | 10/2010 | Tokita | B82Y 10/00 257/40 |
| 2012/0141831 | A1* | 6/2012 | Luo | B82Y 10/00 428/704 |
| 2012/0277414 | A1* | 11/2012 | Yamada | B82Y 10/00 530/401 |
| 2012/0301793 | A1* | 11/2012 | Tsujiuchi | H01B 1/122 429/300 |
| 2014/0113828 | A1* | 4/2014 | Gilbert | G01R 33/0354 505/100 |
| 2018/0292279 | A1* | 10/2018 | Chen | G01L 5/228 |

FOREIGN PATENT DOCUMENTS

| | | |
|---|---|---|
| KR | 10-2006-0022950 A | 3/2006 |
| KR | 10-2011-0006136 A | 1/2011 |
| KR | 10-2011-0092485 A | 8/2011 |
| KR | 10-2013-0068936 A | 6/2013 |

* cited by examiner

PROTEIN-BASED NONVOLATILE MEMORY DEVICE AND METHOD FOR MANUFACTURING THE SAME

CROSS-REFERENCE TO RELATED APPLICATION

This application claims the benefit of Korea patent application No. 10-2017-0121355 filed on Sep. 20, 2017, the entire content of which is incorporated herein by reference for all purposes as if fully set forth herein.

BACKGROUND

Field of the Present Disclosure

The present disclosure relates to a protein-based nonvolatile memory device and a method for fabricating the same. The present disclosure relates, more specifically, to a protein-based nonvolatile memory device using conductive filaments and a method for producing the same.

Discussion of Related Art

A resistive switching (RS) device, called a conductive bridging random access memory (CBRAM) device or atomic switching device, is a building block essential for information storage and logic components because of its high density, large scale scalability, low power consumption and high reliability. The most widely used silicon-based RS device exhibits excellent performance as an electronic device. However, because many chemicals are used in the manufacturing process thereof and it is based on minerals, and, thus, has very low biocompatibility, this is not suitable for wearable information processing devices, smart skins, and biomedical fields.

In order to solve these problems, researches are being made to use organic substances, especially biomaterial, which are not toxic. In known studies, natural proteins such as fibroin, cericin, gelatin, albumin, and ferritin are used as insulating layers in RS devices. The level of the above-mentioned research is such that the degree of utilization of such research is not higher.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The purpose of the present disclosure is to provide the protein-based nonvolatile memory device capable of solving immunogenicity problems that may occur in a bioimplant device, using a biomaterial protein as a major component of a nonvolatile memory device.

Another object of the present disclosure is to provide a method of fabricating the protein-based nonvolatile memory device that improves the characteristics of the RS device by precisely controlling the formation of conductive filaments applied to non-volatile memory devices.

In a first aspect of the present disclosure, there is provided a nonvolatile memory device comprising: two electrodes; and a protein switching layer interposed between the two electrodes and including an amino acid, wherein then a voltage is applied to one of the electrodes, the amino acid chelates with an active electrode material to form a conductive filament, wherein the formation of the conductive filament allows a resistance state of the device to vary.

In one embodiment of the device, the protein switching layer includes at least one protein of His, Cys, Asp, Lys and Glu.

In one embodiment of the device, the active electrode material includes at least one of copper (Cu), silver (Ag), aluminum (Al), nickel (Ni), iron (Fe), cobalt (Co) and zinc (Zn).

In one embodiment of the device, the protein switching layer includes one selected from a group consisting of DnaJ, lysozyme, Sericin, Fibroin, Bandeiraea simplicifolia agglutinin (BSA), Gelatin, Ferritin, and DnaK.

In one embodiment of the device, the active electrode material is doped in the protein switching layer; or the active electrode material is contained in at least one of the two electrodes.

In one embodiment of the device, when a first electrode of the two electrodes is grounded, and a positive voltage is applied to a second electrode of the two electrodes, the device changes from a high resistance state to a low resistance state and is maintained in the low resistance state, wherein when a negative voltage is applied to the second electrode, the device back changes from the low resistance state to the high resistance state.

In one embodiment of the device, a first electrode of the two electrodes is grounded, wherein a second electrode thereof is formed of an active electrode material, wherein when a positive voltage is applied to the second electrode, the active electrode material in the second electrode is injected into the protein switching layer to form a conductive filament, such that the device changes from a high resistance state to a low resistance state and is maintained at the low resistance state, wherein when a negative voltage is applied to the second electrode, the device back changes from the low resistance state to the high resistance state.

In one embodiment of the device, a first electrode of the two electrodes is grounded, wherein a first active electrode material is doped in the protein switching layer, wherein the second electrode is made of a second active electrode material having a lower chelation degree with the amino acid included in the protein switching than the first active electrode material has, wherein when a first positive voltage is applied to the second electrode, the first active electrode material is first chelated to form a first conductive filament, such that the device changes to an intermediate resistance state, wherein when a second positive voltage higher than the first voltage is applied to the second electrode, the second active electrode material is chelated to form a second conductive filament, such that the device changes to a low resistance state and is maintained at the low resistance state, wherein when a negative voltage is applied to the second electrode, the device back changes from the low resistance state to a high resistance state.

In one embodiment of the device, a size of the conductive filament formed upon the voltage application is varied depending on a pH of a protein solution used to form the protein switching layer.

In one embodiment of the device, when the protein switching layer includes a recombinant chaperone rDnaJ containing 16 histides (His), a pH of a protein solution used to form the protein switching is at least 6.

In a second aspect of the present disclosure, there is provided a method for manufacturing a nonvolatile memory device, the method comprising: providing a base substrate;

disposing at least one electrode on the substrate; and forming a protein switching layer on the electrode using a protein solution containing a protein therein, wherein the protein includes an amino acid, wherein then a voltage is applied to the electrode, the amino acid chelates with an active electrode material to form a conductive filament, wherein the formation of the conductive filament allows a resistance state of the device to vary.

In one embodiment of the method, a pH of the protein solution is controlled to adjust a size of the conductive filament formed in the protein switching layer when the voltage is applied to the electrode.

In one embodiment of the method, forming the protein switching layer includes performing a thermal denaturation method using the protein solution.

In one embodiment of the method, the protein solution has a pH equal to or higher than an acid dissociation constant of the amino acid contained in the protein.

The effects of the present disclosure are as follows. However, the effects of the present disclosure are not limited to the following.

According to the present disclosure, the protein-based nonvolatile memory device and the method for fabricating the same, the protein distributed in the body of an organism, including humans, may be used to alleviate immunogenicity that may occur in a bio device insertable into the body.

Further, precisely controlling the formation of the conductive filaments may allow the characteristics of the device including the conductive filament to be improved. The control of such conductive filament formation has the advantage that it can also be used when not only the natural proteins but also recombinant proteins, design proteins and peptides are applied to the switching devices.

DETAILED DESCRIPTIONS

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

Figure 1A:
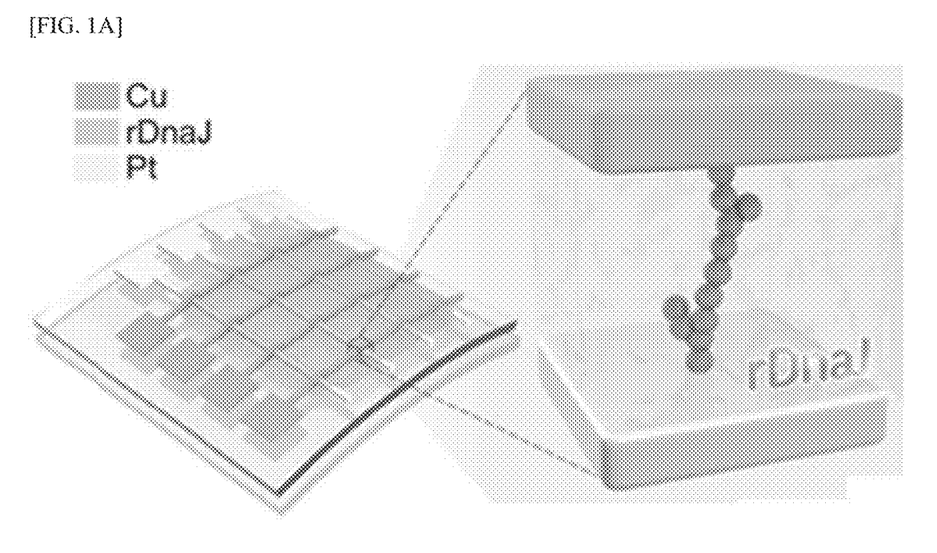
FIGS. 1A to 1C illustrate the structure and operating principle of a nonvolatile memory device according to one embodiment of the present disclosure.
Figure 1B:
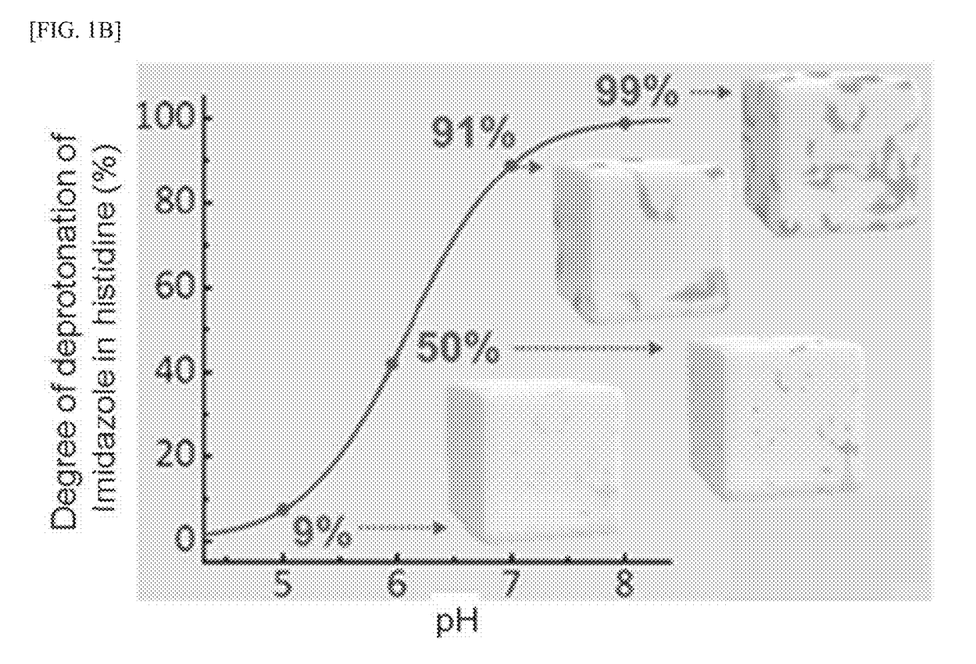
Figure 1C:
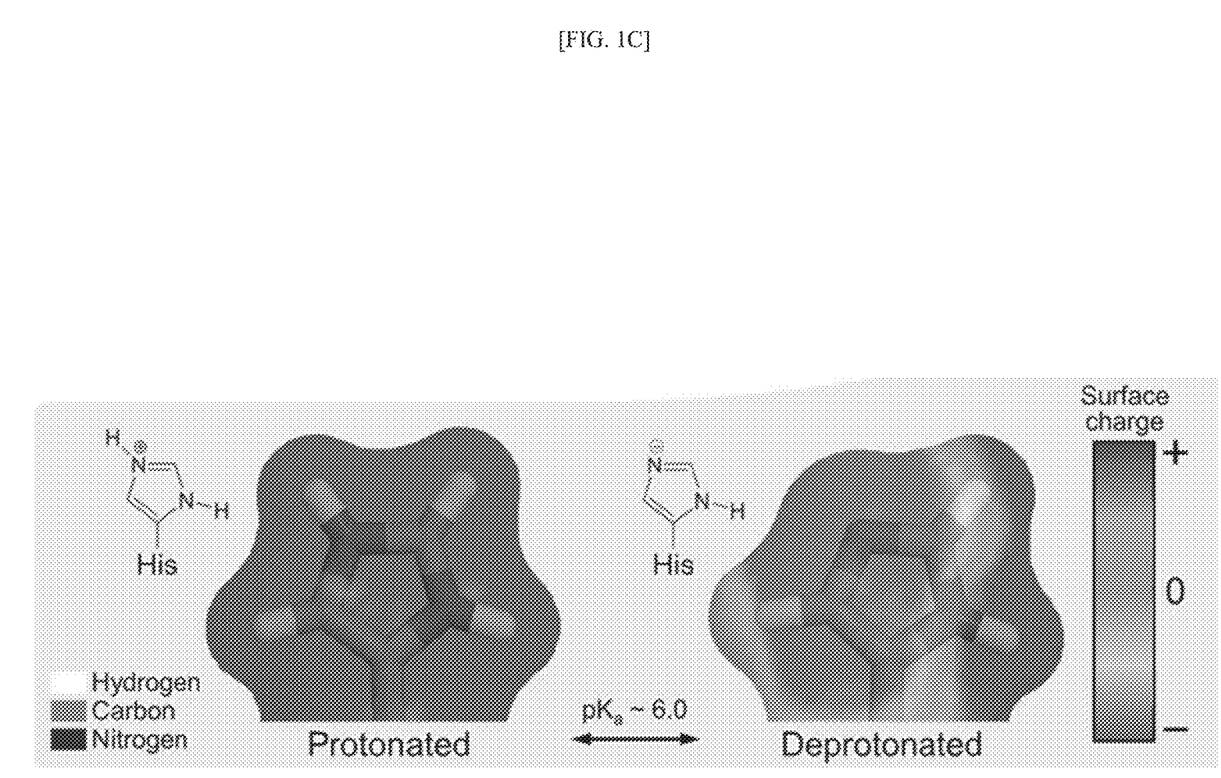

FIGS. 1A to 1C illustrate the structure and operating principle of a nonvolatile memory device according to one embodiment of the present disclosure.

Referring to FIGS. 1A and 1B, the protein-based nonvolatile memory device according to the present disclosure includes two opposed electrodes and a protein switching layer interposed therebetween. The nonvolatile memory device changes its resistance and maintains its resistance state when a voltage is applied to the two electrodes.

The nonvolatile memory device may be formed on a base substrate. In this regard, the base substrate may include not only a glass substrate or a silicon wafer but also a flexible substrate such as a polymer substrate. The base substrate may be used without any particular limitation. The first electrode is formed on the base substrate. A protein switching layer is formed on the first electrode. The second electrode is formed on the protein switching layer. Thus, the nonvolatile memory device may be formed. Alternatively, the first and second electrodes may be spaced apart to create an internal space between them. Then, by filling the internal space with the protein switching layer, the nonvolatile memory devices may be formed.

Each of the first electrode and the second electrode may be formed of an active electrode material or may be formed of a non-active electrode material. Alternatively, the first electrode may be formed of an active electrode material, while the second electrode may be formed of a non-active electrode material. An active electrode material may be doped into the protein switching layer.

Active electrode material is a metal that can interact with amino acids through chelation. The metal may be a single metal or alloy. Examples of active electrode materials may include copper Cu, silver Ag, aluminum Al, nickel Ni, iron Fe, cobalt Co, zinc Zn, and the like. These may be used alone or in combination of two or more in the form of an alloy. The active electrode material is defined as one that is chelated with an amino acid in the form of an ion to form a coordination bond, such that the active material may interact with an amino acid. The intensity of the interaction between the active electrode material and the amino acid is as follows: the strength of copper is the highest, followed by nickel. Iron, cobalt, silver, and zinc are active electrode materials that are relatively weaker in interaction with amino acids than copper or nickel.

As long as the non-active electrode materials are materials that do not interact with amino acids, that may be used as an electrode to which a voltage may be applied, the material may be used without particular limitation. Examples of the non-active electrode materials include platinum Pt, tungsten W, titanium nitride TiN, graphene graphene, reduced graphene oxide, rGO, titanium Ti, niobium Nb, hafnium Hf, magnesium Mg, zirconium Zr, aluminum Al, vanadium V, europium Eu, tantalum Ta, manganese Mn, and the like. These may be used alone or in combination of two or more.

The protein switching layer may be formed of a polymer material composed of amino acids. In this connection, a polymer material composed of amino acids means a natural protein, a recombinant protein, a designed protein, a natural peptide, or a design peptide. Examples of the amino acids contained in the polymer material forming the protein switching layer include His, Cys, Asp, Lys and Glu.

The greater the content of amino acids listed above, it is easier to form conductive filaments in the protein switching layer. It is also possible to control the memory characteristics in a nonvolatile memory device by adjusting the ratio of the amino acid of the polymer material forming the protein switching layer. Specific examples of the material forming the protein switching layer include DnaJ, lysozyme, Sericin, Fibroin, BSA (Bandeiraea simplicifolia agglutinin), Gelatin, Ferritin, DnaK and the like.

The protein switching layer may be atomically thinned and uniformly formed at 2 to 4 nm, which facilitates electrochemical modulation of the protein switching layer, using a thermal denaturation method, in a proton dependent manner. When the protein switching layer is formed by a general coating method such as spin-coating, it is very difficult to form a thin film having a uniform overall thickness. Therefore, it is preferable to use the thermal denaturation method for forming the protein switching layer.

In one embodiment, the protein switching layer is formed by immersing the substrate, on which the electrode is formed, in a buffer solution in which the protein is dissolved. Alternatively, the protein switching layer may be formed on the substrate by dropping and rinsing the solution to a portion on the substrate where protein is required. As a solvent for preparing a buffer solution, distilled water, pH-controlled phosphate buffer, Tris-buffer, borate-buffer, Citric-buffer, Acetic-buffer, CHES-buffer or saline solutions of these salts may be used in order to control the characteristics of amino acids in proteins.

Alternatively, the protein switching layer may be formed by preparing a protein solution and coating the protein solution onto the substrate. As a coating method, spin coating or the like may be used. A heat treatment step at 60 to 100 degree C. may be added to the protein layer in the state where the protein layer is formed. The thickness of the formed protein switching layer may be from 1 nm to 1 micrometer.

In a specific example, a buffer of 10 mM phosphate pH 5-8 was used to produce a 1 to 4 μM concentration of rDnaJ solution. 20 [mu] 1 of rDnaJ solution was drop-cast on a Pt electrode formed on a base substrate, using a micropipette. The drop-cast solution may be heated at 70 DEG C. for 20 minutes to form a protein switching layer having a uniform thickness.

The intensity of the interaction by chelation between amino acids and metals appears differently depending on the type of amino acid and metal. When the first electrode may be formed of an active electrode material, and the second electrode may be formed of a non-active electrode material, or when the first electrode and the second electrode are all formed of active electrode material, and different types of active electrode materials are used, followings occur when a voltage is applied thereto: conductive filaments made of a metal that strongly interacts with amino acids are first partially formed to create an intermediate resistance state.

When a voltage is continuously applied, a conductive filament made of a metal having a weak interaction degree with the amino acid is formed, resulting in a low resistance state.

In order to create the intermediate resistance state, the protein switching layer must be provided with a small amount of metal that is highly interactive (chelating) with the amino acid. In order to realize this, an active electrode material forming an electrode may be selected as an alloy containing two or more different metals, or the electrode may be composed of multiple layers with different active properties, or alternatively, the active electrode material may be doped in the protein switching layer.

In one embodiment, when an alloy is used to provide intermediate resistance, the concentration of at least one metal with a high degree of interaction with the protein switching layer may be greater than 0% and smaller than 10% based on the total alloy. In this way, an electrode may be constructed.

In one embodiment, when the electrode is composed of multiple layers, a metal layer formed of one or more kinds of highly interacting metals may be inserted with a thickness of more than 0 nm and 5 nm or less between the protein layer and a layer of the metal having a low degree of interaction with the protein switching layer.

In one embodiment, when doping a metal that interacts with the protein switching layer within the protein switching layer, the concentration of the metal ion doped in the protein switching layer may be more than 0 and less than 2 mM with respect to the entire protein switching layer. The metal may be doped into the protein switching layer using a buffer solution.

In one embodiment, the first electrode may be a Pt electrode as a lower electrode formed on the base substrate. The second electrode may be a Cu electrode as a lower electrode formed on the protein switching layer. Between the Pt electrode and the Cu electrode, a chaperone recombinant DnaJ (chaperone rDnaJ) may constitute the protein switching layer. Hereinafter, a nonvolatile memory device according to one embodiment of the present disclosure having such a structure will be referred to as an "rDnaJ RS device". In this case, chelation between the amino acid and the metal, formation of the conductive filament, implementation of the intermediate resistance state, etc. will be described.

Referring to FIG. 1C with FIGS. 1A and 1B, in the rDnaJ RS device, and in the protein switching layer interposed between the Pt electrode and the Cu electrode, under the positive potential bias, oxidized Cu2+ from the Cu electrode may be injected into the protein switching layer. In this connection, depending on the degree of metal ion chelate, this layer may function as a switching layer.

Depending on the amino acid composition of the protein that constitutes the protein switching layer or the pH solution used to form the protein switching layer, the amount of copper ions injected or the amount of copper ions interacting with the protein switching layer are changed.

The chelation in the protein switching layer depends on the pH such that this is regulated by quantization and/or deprotonation of the imidazole group in the histidine residue of rDnaJ protein. The rDnaJ protein comprises a hexa-His-tag fused at its N-terminus. This results in the addition of six histidines to the chaperone rDnaJ. Thus, the protein comprises a total of 16 histidine residues. In the wild-type DnaJ, 50% of the 10 histidine residues are limited to the CR cysteine rich domain and are coordinated to Cu2+ by modulating cysteine residues.

In the present disclosure, since the pH is in the range of 5 to 8, most of the SH group (sulfhydryl group, pKa=8.2) in cysteine is quantized in the above pH range. Thus, most of Cu 2+ is likely to be mediated with histidine residues by rDnaJ. When, within this range, the N of the imidazole is dequantized, the histidine residue acts as a strong chelator for Cu2+. This gives the lone pair of electrons by the electron-deficient metal ions.

In histidine, the acid dissociation constant (pKa) of the imidazole side chain is about 6. At pH above this pKa value, most of the imidazole ring is deprotonated and metal-protein coordination takes place. Further, at a pH lower than the pKa value, (as in the Henderson-Hasselbalch equation), the imidazole ring is mostly quantized. That is, de-quantized histidine can also chelate metal ions.

During quantization, the imidazole ring has two NH bonds, and represents a positive charge evenly distributed across two nitrogen atoms. This results in a net charge of zero at the imidazole group. As a result, the metal chelating ability of the protein switching layer may be controlled by varying the solution pH. Because of this nature, it is also possible to optimize the characteristics of the device by simply and effectively controlling the amount of electrode-fed metal ions in the protein switching layer.

FIGS. 2A to 2D are graphs showing the characteristics of a nonvolatile memory device according to one embodiment of the present disclosure.

Figure 2A:
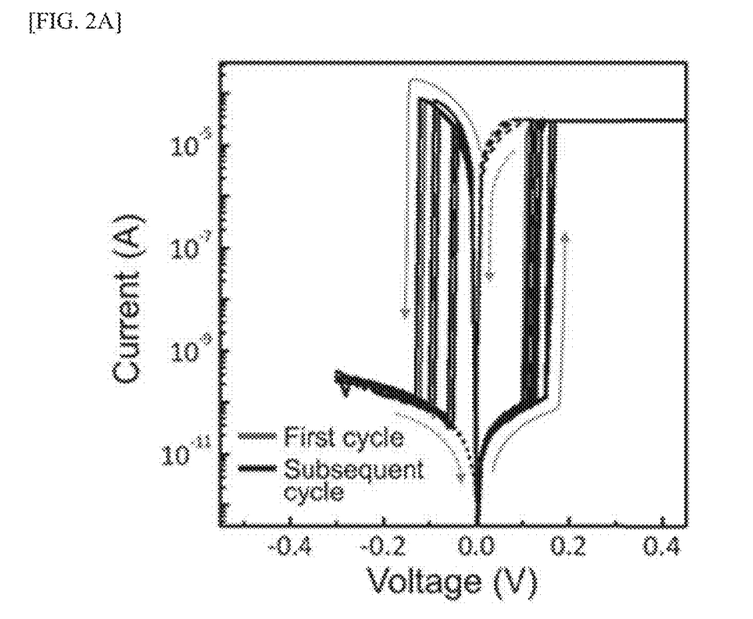
FIGS. 2A to 2D are graphs showing the characteristics of a nonvolatile memory device according to one embodiment of the present disclosure.

Referring to FIG. 2A, it may be seen that the rDnaJ RS device, which is a nonvolatile memory device according to one embodiment according to the present disclosure, exhibits its electrical characteristics in the DC voltage sweeping mode electrically during its repetitive operating cycle.

The DC bias is applied to the Cu electrode, and the Pt electrode is grounded. Initially, the device was in a high resistance state (HRS). As the voltage is swept from 0 to + in a current compliance manner, and, then, the bias reaches a threshold voltage of 0.12 V, the current rapidly increases. This is called the SET process. The corresponding voltage corresponding thereto may be defined as Vset.

After the SET process, the nonvolatile memory device is maintained in the low resistance state (LRS). As the voltage is swept from zero to a negative value, the resistance state is changed from LRS to HRS at a voltage of −0.08 V defined by Vreset. This is called the RESET process.

As shown in FIG. 2A, the nonvolatile memory device according to the present disclosure exhibits stable bipolar RS characteristics over multiple switching cycles while keeping Vset and Vreset very low. This may be a key factor in meeting the requirements of low-power operation in future electronic devices.

Recently, the characteristics of an RS device according to a switching material reported to constitute a switching layer as a biocompatible material are shown in Table 1 below.

TABLE 1

| Switching material | Vset (V) Mean/Std. dev. | Vreset (V) Mean/Std. dev. | $R_{HRS}/R_{LRS}$ | Retention Time(s) |
| --- | --- | --- | --- | --- |
| Tobacco mosaic virus | 3.1/NA | −2.4/NA | $10^3$ | $10^3$ |
| Ag-doped chitosan | 0.5/NA | −0.5/NA | $10^5$ | $10^4$ |
| Dry-Cured albumen | 0.6/NA | 2.2/NA | $10^3$ | $10^4$ |
| Sericin | 2.5/NA | −0.8/NA | $10^6$ | $10^3$ |
| Silk fibroin | 10.4/NA | −11.5/NA | 10 | $10^3$ |
| Lysozyme/PSS | 1.0/NA | −1.3/NA | $10^3$ | $10^4$ |
| PAH/ferritin 15 | 1.8/NA | −1.5/NA | $10^2$ | $10^4$ |

TABLE 1-continued

| Switching material | Vset (V) Mean/Std. dev. | Vreset (V) Mean/Std. dev. | $R_{HRS}/R_{LRS}$ | Retention Time(s) |
|---|---|---|---|---|
| NiO/ferritin | 1.8/NA | −0.8/NA | $10^4$ | N/A |
| rDnaJ (the present disclosure) | 0.12/0.015 | −0.08/0.029 | >$10^6$ | >$10^6$ |

Referring to Table 1, when Vset and Vreset of the nonvolatile memory device according to the present disclosure are compared with those of RS devices using other switching materials, Vset and Vreset of the nonvolatile memory device according to the present disclosure may be confirmed to have very low Vset and Vreset. The nonvolatile memory device according to the present disclosure may be confirmed to have a high on/off ratio of more than $10^6$ and a retention time of more than $10^6$ second, may be confirmed to have excellent uniformity.

Figure 2B:
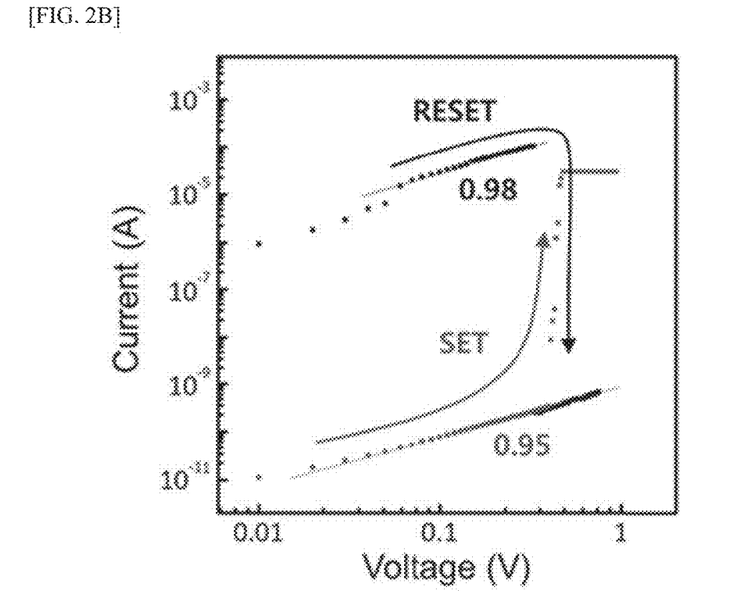

FIG. 2B plots the I-V curve obtained from the rDnaJ RS device, a nonvolatile memory device according to one embodiment of the present disclosure in a double-log scale to further investigate the conductive mechanism.

Referring to FIG. 2B, it may be seen that the slope of the I-V curve is about 1 for both HRS and LRS over the entire voltage range. These results indicate that the current flow in the rDnaJ RS device is dominated by ohmic conduction rather than by space charge limiting current conduction. We may see that the characteristics that are common in various RS devices also appear in the rDnaJ RS device.

To verify the stability of the nonvolatile memory device, the rDnaJ RS device according to one embodiment of the present disclosure, cyclic endurance and data retention test are carried out. The reliability of the device was evaluated by repeatedly measuring the current-voltage characteristics in various devices. The results are shown in FIG. 2C and FIG. 2D.

Figure 2C:
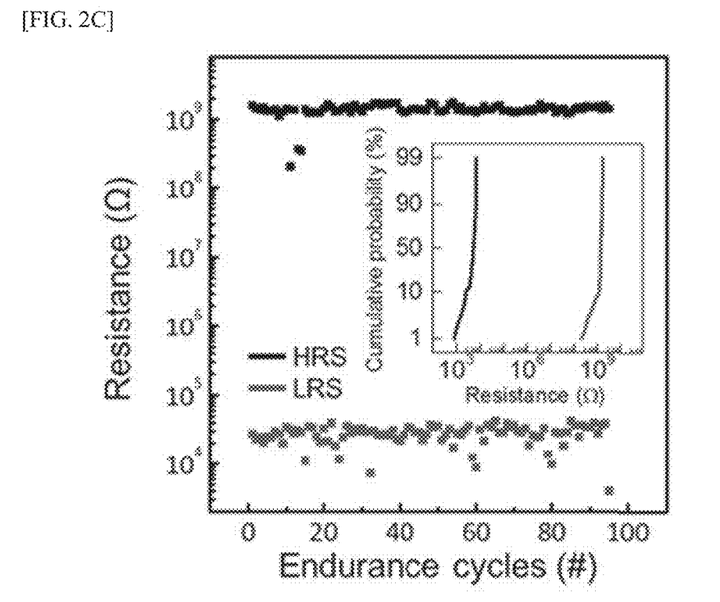

Referring to FIG. 2C, the cyclic voltage is applied as follows: the voltage was applied from 0 to 0.5 V and then applied again from 0 to 0.3 V. The read voltage was set to 0.03 V to avoid resistance changes. In the rDnaJ RS device, LRS and HRS states appear to remain stable during a cyclic test of about 100 times and a test time of 106 seconds. It may be confirmed that the ratio of the current between the LRS and HRS states is 106 or larger.

Referring to the graph inserted in the graph of FIG. 2C, the cumulative probability distribution for the resistance RLRS in the LRS and RHRS resistance in the HRS may be checked. Each data point was obtained from a total of 120 switching cycles applied to 12 randomly selected devices. It may also be confirmed that RLRS and RHRS exhibit average resistance values of 5 k ohm and 2 G ohm respectively. This value fluctuates about 1.1 times, and maintains a memory window of at least 104. It may be confirmed that the durability and retention characteristics of the rDnaJ RS device are much superior to those of the RS device using other switching materials shown in Table 1 above.

Figure 2D:
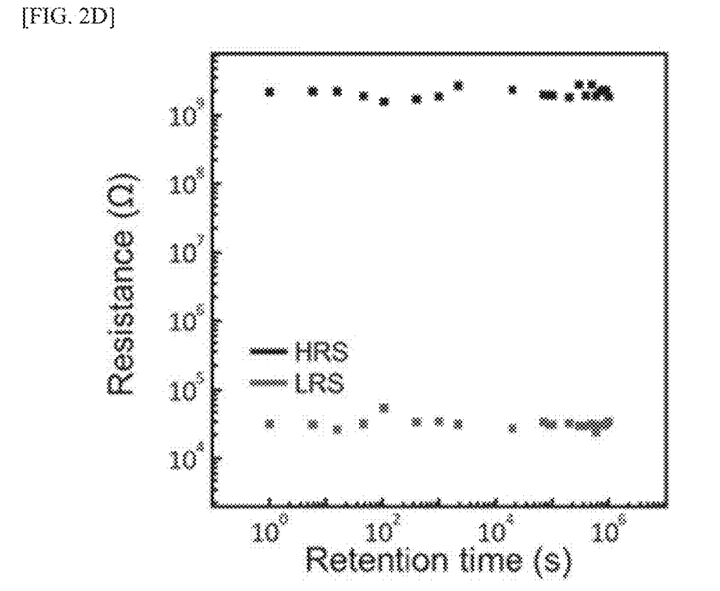

FIG. 2D shows the RHRS and RLRS values obtained from the rDnaJ RS device as a function of retention time. In the case of the RS device using the switching material known in the prior art, due to the lack of electrochemical control ability, there is a limit of the low on-off ratio and short retention time. According to the present disclosure, it may be confirmed that a high-performance nonvolatile memory and a switching device can be provided using a controlled rDnaJ switching layer.

FIGS. 3A to 3E are drawings illustrating the pH dependent nature of the protein switching layer characteristics of a nonvolatile memory device according to one embodiment of the present disclosure.

Figure 3A:
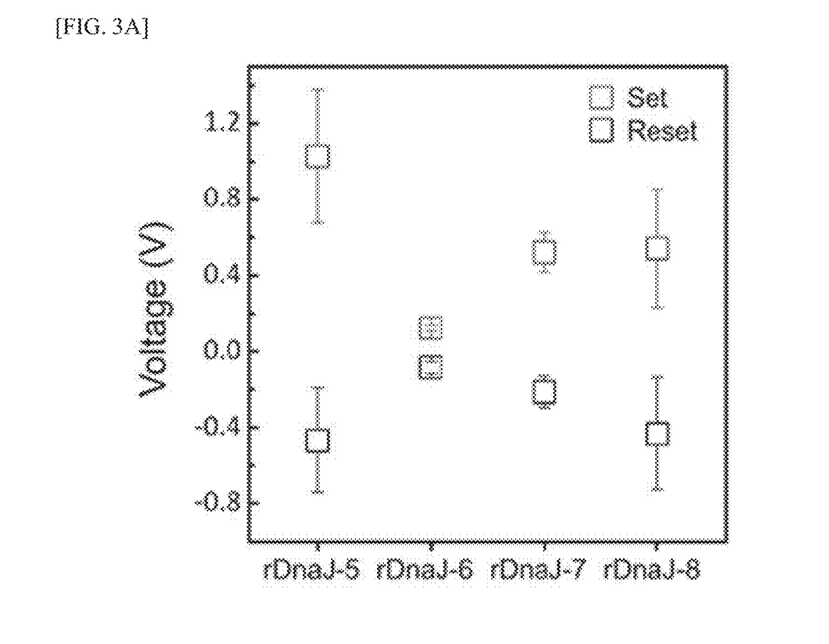
FIGS. 3A to 3E are drawings illustrating the pH dependent property of the protein switching layer characteristics of a nonvolatile memory device according to one embodiment of the present disclosure.

FIG. 3A is a graph plotting the Vset and Vreset values of the rDnaJ RS device obtained by adjusting the quantization state by adjusting the pH for rDnaJ protein. While the pH is set to 5, 6, 7 and 8, the switching layer is prepared at each of pH. Thus-produced devices may be referred to as rDnaJ-5, rDnaJ-6, rDnaJ-7 and rDnaJ-8 respectively.

Referring to FIG. 3A, the SET and RESET voltages are the largest at rDnaJ-5 and the smallest at rDnaJ-6. As the pH increased, the SET and RESET voltages increased further. This tendency suggests the following: it may be seen that, in order to achieve stable low-power switching operation, when forming an rDnaJ switching layer at pH 6, the RS device exhibits the best characteristics.

The behavior of the nonvolatile switching layer is obtained from the rDnaJ RS device due to the formation and rupture of the conductive filament. The + bias is induced with the aid of amino acids that dissolve Cu atoms in the form of Cu ions into the protein switching layer and have metal binding affinity. The Cu ions then diffuse to the lower electrode and are reduced to Cu atoms. This process may be repeated to form Cu filaments between the two electrodes. The resistance state of the RS device changes from HRS to LRS. This phenomenon does not occur in RS devices containing two Pt electrodes. When a reverse voltage is applied, filament rupture may occur through electrochemical dissolution by heat.

Figure 3B:
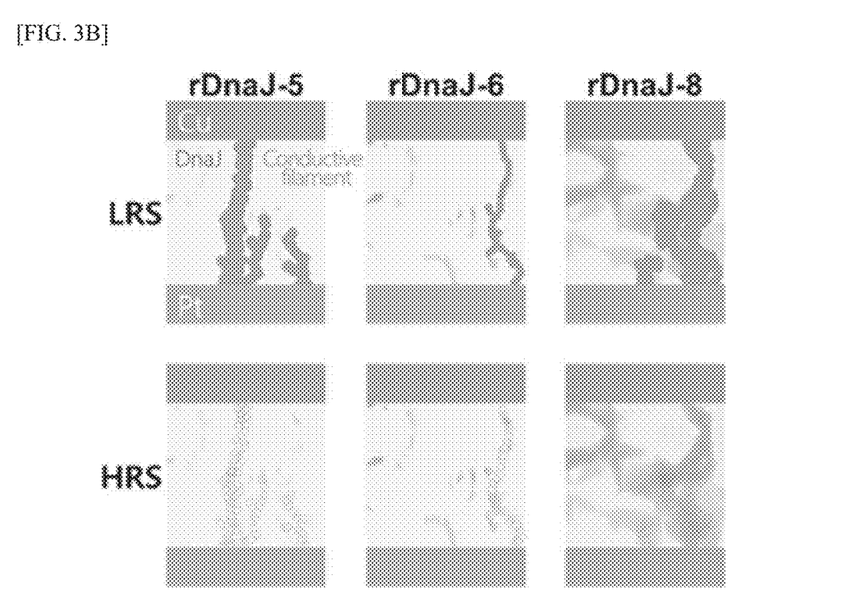

FIG. 3B is a schematic representation of Cu conductive filament formation for the rDnaJ RS device under + bias applied to a Cu electrode. Referring to this figure, the oxidation and reduction of Cu ions in the upper Cu electrode affected the operation of the RS device. It may also be confirmed that the amount of chelated Cu ion in the protein switching layer is controlled by the degree of quantization of rDnaJ. The correlation between the amount of chelated Cu ions and the degree of quantization was confirmed by electrochemical measurements.

In rDnaJ-5, most of the lone electron pairs in the imidazole nitrogen of the histidine residue were quantized and could not interact with metal ions. According to the Henderson-Hasselbalch equation, at pH 5, 6, 7 and 8, the dequantized imidazole nitrogen fractions of the histidine moieties were 0.09, 0.50, 0.91 and 0.99, respectively.

Thus, in rDnaJ-5, only a small number of Cu ions were chelated. A large voltage was required to set the RS device. As a result, it may be seen that a thick filament is formed, thus, the voltage required for RESET increases, and, thus, the operating voltage increases. These results indicate that the Cu ions are chelated into the switching layer, which may improve performance.

On the other hand, in rDnaJ-8, chelation of Cu ions occurs excessively. As a result, there is a limitation in precisely controlling filament formation. As a result, it may be confirmed that a thick filament is formed. Thus, a considerable amount of energy was required to remove excess Cu ions in the protein switching layer. As a result, a high operating voltage and a large SET/RESET voltage distribution were observed. To solve this problem, it is possible to improve the performance by reducing the chelation rate of Cu ions. That is, in FIG. 3A, the SET and RESET voltages measured in the rDnaJ RS device may be designed when (i) device performance optimizes the metal chelate affinity of the protein, (ii)

a low power, biocompatible material switching device with good uniformity optimizes the quantization state of the protein.

In other words, as shown in FIG. 3A, devices can be designed, such as rDnaJ-6, with a very low Vset of about 0.12 V and a limited variability of Vreset of about 0.08 V. As a result, it may be confirmed that the RS device using rDnaJ-6 exhibits excellent nonvolatile RS characteristics, which surpass the characteristics of the RS device using the other switching materials shown in Table 1.

Figure 3C:
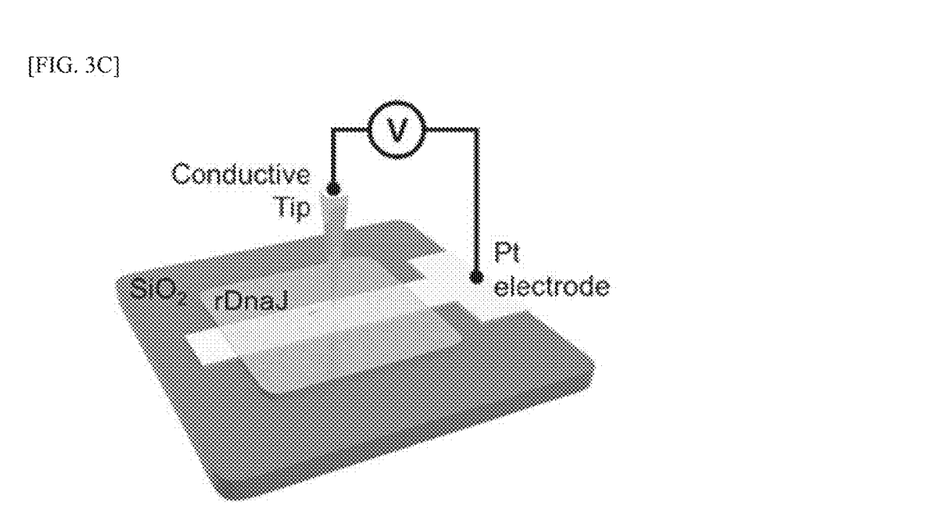

Conductive atomic force microscopy (CAFM) measurements were conducted to investigate the conductive filaments formed in the rDnaJ switching layer.

FIG. 3C shows a schematic diagram of the CAFM measurement configuration. Samples were prepared by applying an electrical SET process followed by etching the Cu electrode of each rDnaJ device. The local filament conduction pathway in the protein switching layer was scanned using a CAFM tip within the 5×5 µm2 area. The AFM measurements were performed simultaneously to examine the surface morphology of thermally denatured rDnaJ in the Pt layer and to monitor damage due to overetching of Cu.

The surface of the protein switching layer where the Cu electrode was etched showed a uniform mean square root erosion of less than 1 nm regardless of the degree of positivity.

Figure 3D:
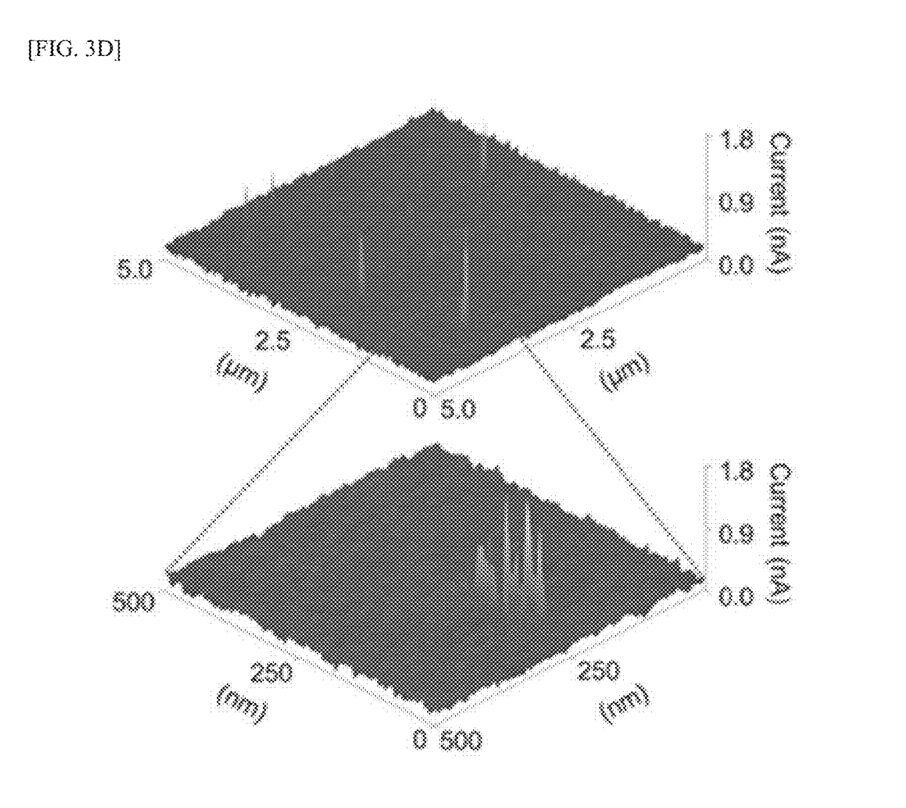

FIG. 3D shows the surface current mapping image of the rDnaJ-6 device from the CAFM measurement. Referring to this figure, it may be confirmed that the filament conduction path was formed in the LRS but not in the HRS state. The high magnification CAFM image shown in the inset inserted inside FIG. 3d shows the local filaments defined in the region of about 90 nm2.

Figure 3E:
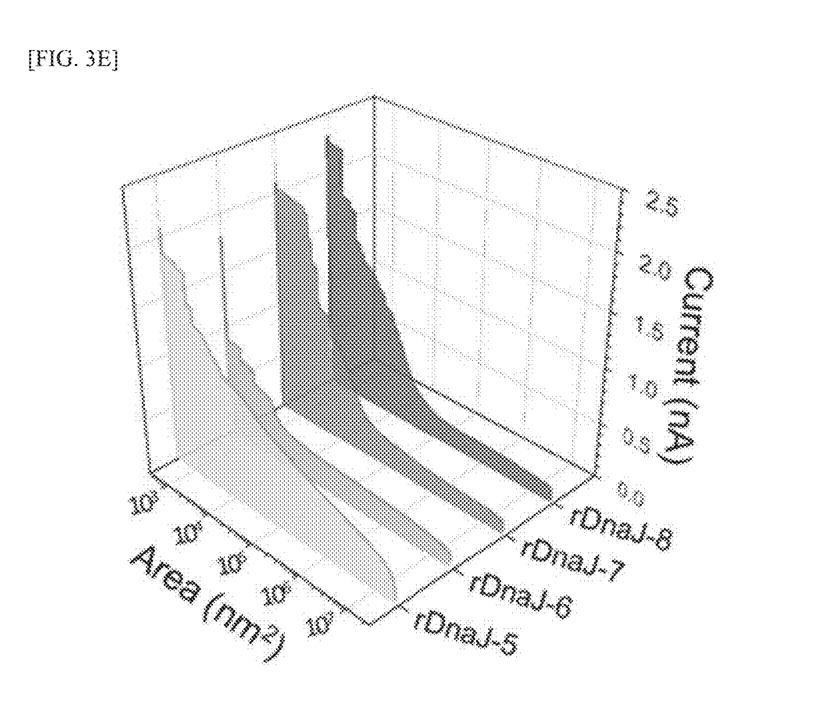

FIG. 3E shows the current distribution profiles measured from the conductive filaments in each of the rDnaJ-5 to rDnaJ-8 quantized and formed to different degrees. Referring to FIG. 3E. the maximum filament currents measured from the rDnaJ-5, rDnaJ-6, rDnaJ-7 and rDnaJ-8 switching layers were 2.2, 1.8, 2.1 and 2.4 nA, respectively. Significantly, each sample showed a distinct current profile indicating the size of the conductive filament in each switching layer. A narrower distribution of filament current was measured for rDnaJ-6. Thus, in this case, the filament formation is thinner, thus, lowering Vset/Vreset. This may be effective in suppressing the variability of RS device operation for low power data storage and information processing device applications. In the rDnaJ-5, rDnaJ-7 and rDnaJ-8 devices, a wider current profile distribution was observed. These results show that the filament size can be effectively controlled by the degree of quantization within the switching layer, as described in FIG. 3B.

The broad applicability of the rDnaJ device to the logic gates has been demonstrated by fabricating AND and OR gates using resistors and two rDnaJ-6 devices and a 2×2 crossbar structure. In addition, in addition to the logic gates, the nonvolatile characteristic of the rDnaJ RS device may be used to construct a sequential logic circuit (SR latch), which is a core building block of the digital information processing system. The SR latch includes two output signals Q and Q−. A state thereof may be controlled and stored via two input signals, S (set) and R (reset).

FIGS. 4A to 4E are drawings illustrating the characteristics of a logic circuit including a nonvolatile memory device according to one embodiment of the present disclosure.

Figure 4A:
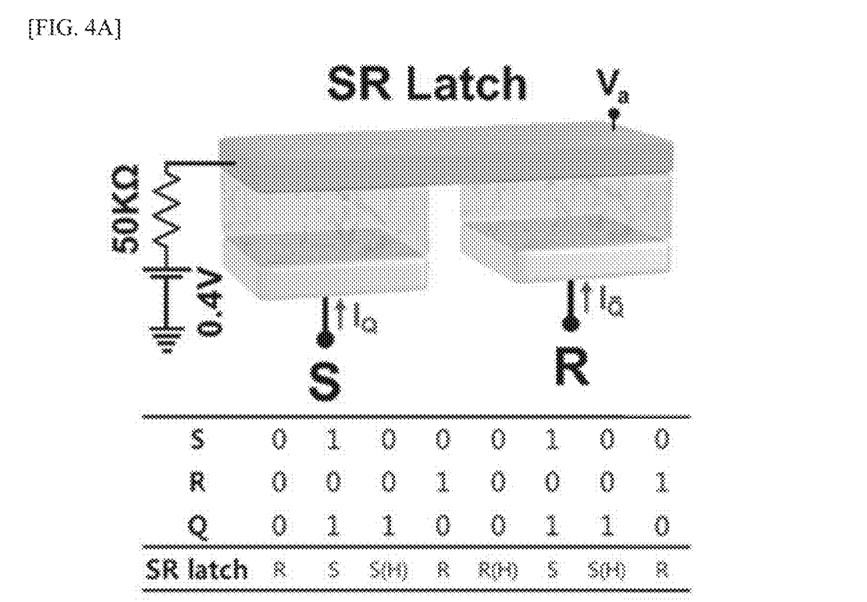
FIGS. 4A to 4E are drawings illustrating the characteristics of a logic circuit including a nonvolatile memory device according to one embodiment of the present disclosure.
Figure 4B:
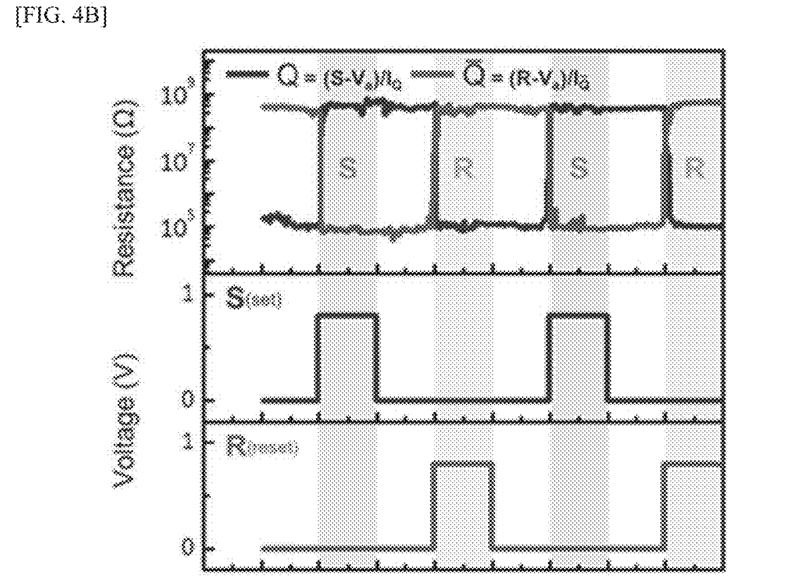

FIG. 4A and FIG. 4B shows the schematic and operation of an SR latch circuit including two rDnaJ-6 RS devices. Referring to these figures, when both S and R are low, no voltage is applied to each device, and the rDnaJ-6 focl output retains its previous value. When either S or R is high and the other is low, the output Q assumes a high or low state. Until the signal applied to R or S is changed, Q remains fixed. These results demonstrate the construction of combinational logic and sequential logic circuits using an integrated rDnaJ-6 RS device. Indeed, it may be seen that the rDnaJ-6 RS device may form the basic building block for future electronic systems.

Figure 4C:
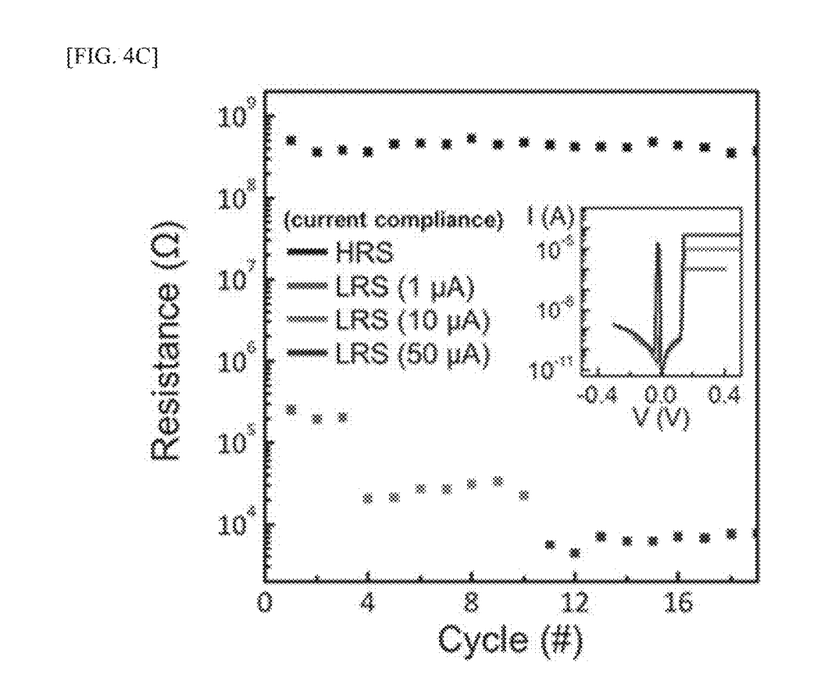

In the LRS state, the current in the rDnaJ RS device was found to be inversely proportional to the current compliance. This result suggests that multilevel switching operation may be achieved when the current compliance is controlled during the SET process.

FIG. 4C shows the multilevel state characteristics which are mediated via the current compliance of the rDnaJ RS device under the operation of the iterative SET/RESET. Referring to this figure, the SET and RESET voltages may be kept almost constant, while the LRS resistance may also increase as the current compliance condition changes from 1 to 60 µA. The LRS state is completely restored to the HRS state via the RESET process.

At a resistivity ratio of about 100, the LRS multi-level state is implemented by deterministically adjusting the current compliance. The set and reset voltages remain nearly constant, while the LRS resistance and current levels change in magnitude order as the compliance current varies.

Figure 4D:
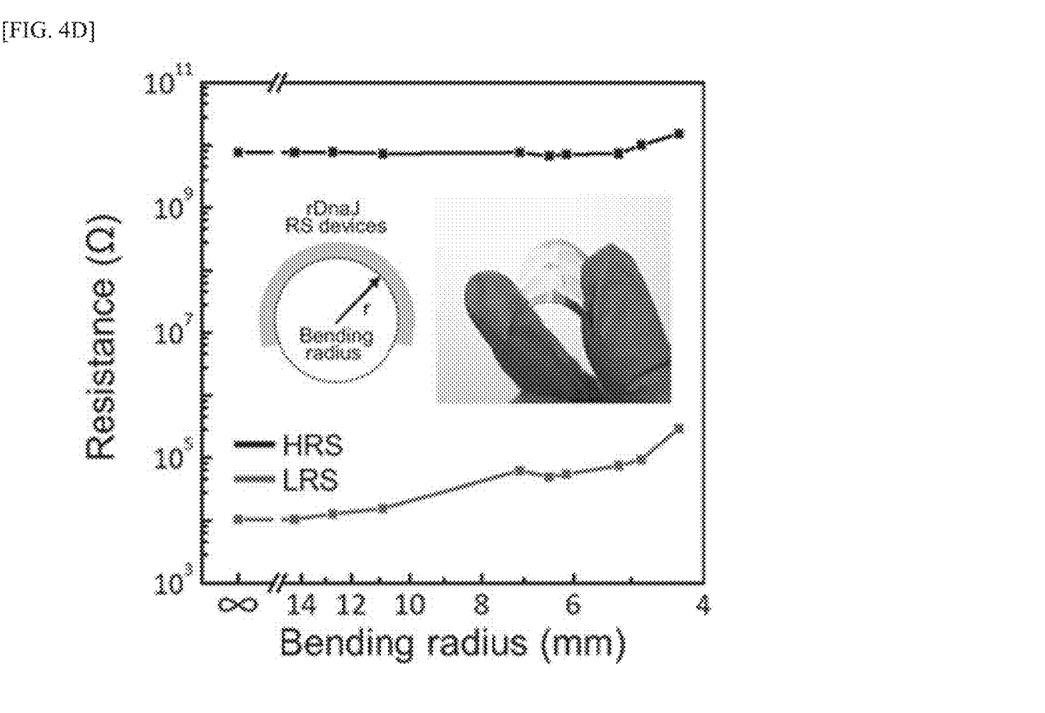
Figure 4E:
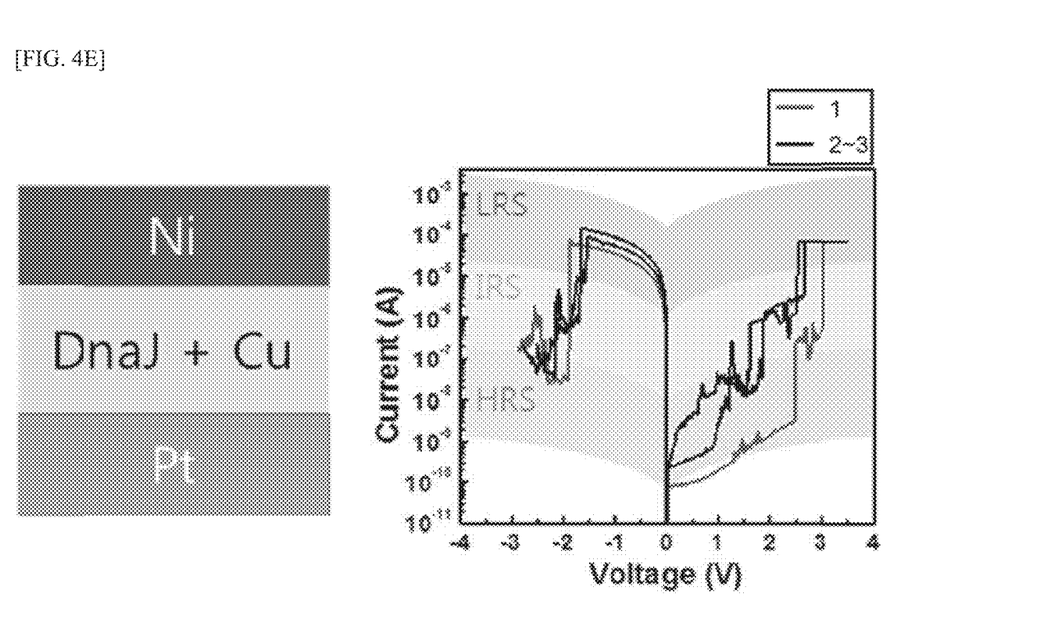

Referring to FIG. 4E, the first electrode as a lower electrode is composed of a Pt electrode. The upper electrode as the second electrode is composed of the Ni electrode. The protein switching layer is doped with Cu. In the RS device thus configured, when the Pt electrode is grounded and the + bias is applied to the Ni electrode. Thus, copper ions contained in the protein switching layer in a small amount form first a fine copper filament, thereby forming an intermediate resistive state (IRS). When a higher voltage is applied, the nickel filaments are formed such that the state change to a low resistance state. That is, the possibility to implement the multi-state memory using two or more metal ions may also be confirmed.

According to these characteristics, flexible devices are of interest in wearable electronic devices and biomedical devices, due to potential applications of the present devices thereto. Such an rDnaJ RS device may be used as such a flexible device. In particular, in the example of the present disclosure, the rDnaJ RS device was fabricated on a PET film and its properties were evaluated.

As shown in FIG. 4D, to investigate the mechanical bend stability of rDnaJ RS devices on PET substrates, measuring the resistance of LRS and HRS as a function of bend radius was executed. At an on/off ratio of 106 or higher, there was no significant change in resistance or on/off ratio. This allows exhibiting the excellent flexibility of the rDnaJ RS device.

While the above description has been described with reference to the preferred embodiments of the present disclosure, it will be understood by those skilled in the art that various changes in form and details may be made therein without departing from the spirit and scope of the present disclosure as set forth in the following claims.

What is claimed is:
1. A nonvolatile memory device comprising:
two electrodes; and
a protein switching layer interposed between the two electrodes and including an amino acid, wherein when a voltage is applied to one of the electrodes, the amino acid chelates with an active electrode material to form a conductive filament, wherein a resistance state of the protein switching layer is variable through formation of the conductive filament, and wherein the active electrode material is doped in the protein switching layer, or the active electrode material is contained in at least one of the two electrodes.

2. The device of claim 1, wherein the protein switching layer comprises at least one protein of His, Cys, Asp, Lys and Glu.

3. The device of claim 1, wherein the active electrode material comprises at least one of copper (Cu), silver (Ag), aluminum (Al), nickel (Ni), iron (Fe), cobalt (Co) and zinc (Zn).

4. The device of claim 1, wherein the protein switching layer comprises at least one selected from the group consisting of DnaJ, lysozyme, Sericin, Fibroin, Bandeiraea simplicifolia agglutinin (BSA), Gelatin, Ferritin, and DnaK.

5. The device of claim 1, wherein when a first electrode of the two electrodes is grounded and a positive voltage is applied to a second electrode of the two electrodes, the protein switching layer has a first resistance state, wherein when the first electrode is grounded and a negative voltage is applied to the second electrode, the protein switching layer has a second resistance state which is higher than the first resistance state.

6. The device of claim 1, wherein when a first electrode of the two electrodes is grounded and a positive voltage is applied to the second electrode comprising the active electrode material, the active electrode material in the second electrode is injected into the protein switching layer to form a conductive filament, such that the protein switching layer has first resistance state, wherein when the first electrode of the two electrodes is grounded and a negative voltage is applied to the second electrode, the protein switching layer has a second resistance state which is higher than the first resistance state.

7. The device of claim 1, wherein the a first active electrode material is doped in the protein switching layer and the second electrode comprises a second active electrode material which has a lower chelation degree with the amino acid included in the protein switching than the first active electrode material, wherein when a first electrode of the two electrodes is grounded and a first positive voltage is applied to the second electrode, the first active electrode material is first chelated to form a first conductive filament, so that the protein switching layer has a first resistance state, wherein when the first electrode is grounded and a second positive voltage higher than the first voltage is applied to the second electrode, the second active electrode material is chelated to form a second conductive filament, so that the protein switching layer has a second resistance state which is lower than the first resistance state, wherein when the first electrode is grounded and a negative voltage is applied to the second electrode, the protein switching layer has a third resistance state which is higher than the first and second resistance states.

8. The device of claim 1, wherein a size of the conductive filament formed upon the voltage application is varied depending on a pH of a protein solution used to form the protein switching layer.

9. A nonvolatile memory device comprising:

two electrodes; and a protein switching layer interposed between the two electrodes and including an amino acid, wherein when a voltage is applied to one of the electrodes, the amino acid chelates with an active electrode material to form a conductive filament, wherein a resistance state of the protein switching layer is variable through formation of the conductive filament, and wherein when the protein switching layer comprises a recombinant chaperone rDnaJ containing 16 histides (His), a pH of a protein solution used to form the protein switching is at least 6.

10. A method for manufacturing a nonvolatile memory device, the method comprising:

providing a base substrate;

disposing at least one electrode on the substrate; and forming a protein switching layer on the electrode using a protein solution containing a protein therein, wherein the protein includes an amino acid, wherein then a voltage is applied to the electrode, the amino acid chelates with an active electrode material to form a conductive filament, wherein the formation of the conductive filament allows a resistance state of the device to vary, and wherein the protein solution has a pH equal to or higher than an acid dissociation constant of the amino acid contained in the protein.

11. The method of claim 10, wherein a pH of the protein solution is controlled to adjust a size of the conductive filament formed in the protein switching layer when the voltage is applied to the electrode.

12. The method of claim 10, wherein forming the protein switching layer includes performing a thermal denaturation method using the protein solution.

* * * * *